United States Patent
Zhu et al.

(10) Patent No.: US 7,797,581 B2
(45) Date of Patent: Sep. 14, 2010

(54) DEVICE AND METHOD FOR TESTING MOTHERBOARD

(75) Inventors: Guang-Yu Zhu, Shenzhen (CN); Hoi Chan, Taipei Hsien (TW); Bo-Tao Wang, Shenzhen (CN); Li-Chuan Qiu, Shenzhen (CN); Da-Hua Xiao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 574 days.

(21) Appl. No.: 11/840,226

(22) Filed: Aug. 17, 2007

(65) Prior Publication Data

US 2008/0313503 A1  Dec. 18, 2008

(30) Foreign Application Priority Data

Jun. 14, 2007  (CN) ............... 2007 1 0200822

(51) Int. Cl.
  *G06F 11/00*  (2006.01)
(52) U.S. Cl. ............... 714/40; 714/25; 714/26; 714/27; 714/30; 714/31; 714/45; 713/1; 713/2
(58) Field of Classification Search ............... 714/25, 714/26, 27, 30, 31, 40, 45; 713/1, 2
See application file for complete search history.

(56) References Cited

U.S. PATENT DOCUMENTS

| | | | |
|---|---|---|---|
| 6,263,373 B1 * | 7/2001 | Cromer et al. ............... 709/250 |
| 6,336,195 B1 * | 1/2002 | Shen et al. ............... 714/34 |
| 6,487,610 B2 * | 11/2002 | Schaefer ............... 710/8 |
| 6,892,248 B2 * | 5/2005 | Thayer ............... 710/2 |
| 7,096,385 B1 * | 8/2006 | Fant et al. ............... 714/30 |
| 7,543,277 B1 * | 6/2009 | Righi et al. ............... 717/125 |
| 7,555,676 B2 * | 6/2009 | Lopez et al. ............... 714/27 |
| 7,634,760 B1 * | 12/2009 | Gumtow et al. ............... 717/125 |
| 2005/0081118 A1 * | 4/2005 | Cheston et al. ............... 714/47 |
| 2006/0080078 A1 * | 4/2006 | Wang et al. ............... 703/26 |
| 2007/0011507 A1 * | 1/2007 | Rothman et al. ............... 714/718 |
| 2007/0016827 A1 * | 1/2007 | Lopez et al. ............... 714/31 |
| 2008/0133961 A1 * | 6/2008 | Kao et al. ............... 714/3 |

* cited by examiner

*Primary Examiner*—Robert Beausoliel
*Assistant Examiner*—Charles Ehne
(74) *Attorney, Agent, or Firm*—Frank R. Niranjan

(57) ABSTRACT

A testing device for testing a motherboard is provided to include a server, a client terminal computer, a debug card and a receiving device. The server is connected to the client terminal computer, for inquiring test results. The debug card is attached to the motherboard, for getting test data. The receiving device connecting with the debug card transmits the test data to the server via a network. A testing method for testing a motherboard is provided to include the following steps: a debug card getting the test data from the motherboard; sending the test data to a receiving device, the receiving device transmitting the test data to a server, the server collating and analyzing the test data; and a client terminal computer inquiring test results via the server.

9 Claims, 3 Drawing Sheets

DEVICE AND METHOD FOR TESTING MOTHERBOARD

BACKGROUND

1. Field of the Invention

The present invention relates to testing devices and testing methods, more particularly to a testing device and a testing method for testing a motherboard.

2. Description of Related Art

A motherboard, which includes a south bridge chip, a north bridge chip and buses and so on, is one of the most important components in a personal computer. Reliability and compatibility of the motherboard is very important.

A manufacturer of motherboards must test reliability and compatibility of the motherboards before shipment. Generally, a motherboard is installed in a computer. After an operating system of the computer is loaded, the computer executes some testing programs in order to get testing results. However, if the motherboard has some problems after the computer is started up and prior to loading of the operating system, no test results are obtained. In this situation, the tester cannot clearly know what is wrong with the motherboard.

What is needed, therefore, is a testing device and a testing method for testing a motherboard before an operating system is loaded.

SUMMARY

A testing device for testing a motherboard is provided, which includes a server, a client terminal computer, a debug card, and a receiving device. The client terminal computer is connected to the server, for inquiring testing results. The debug card is attached to the motherboard, for getting test data. The receiving device connected to the debug card transmits the test data to the server via a network. A testing method for testing a motherboard is provided, which includes the following steps: a debug card getting test data from the motherboard; sending the test data to a receiving device, the receiving device transmitting the test data to a server, the server collating and analyzing the test data; and a client terminal computer inquiring test results via the server.

Other advantages and novel features will be drawn from the following detailed description of preferred embodiments with attached drawings, in which:

DETAILED DESCRIPTION

Figure 1:
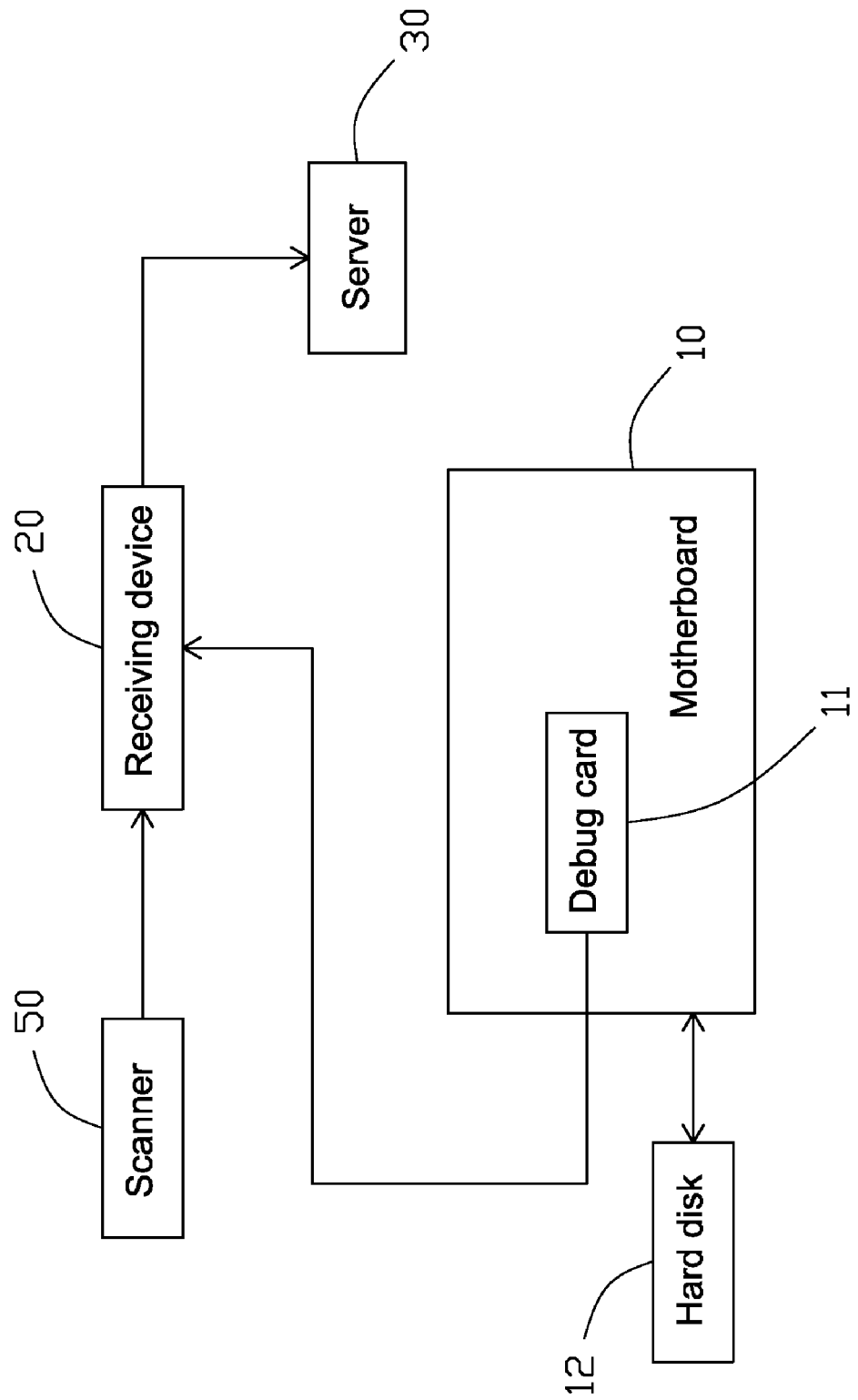
FIG. 1 is a block diagram of a testing device in accordance with an embodiment of the present invention.

Referring to FIG. 1, a testing device in accordance with a preferred embodiment of the present invention for testing a motherboard 10, includes a debug card 11, a hard disk 12, a receiving device 20, a server 30, and a scanner 50. The debug card 11 is attached to the motherboard 10 and is connected to the receiving device 20 via, for example, a serial port. The hard disk 12 is coupled to the motherboard 10. The receiving device 20, for example, an Nport, is connected to the scanner 50 via, for example, a PS/2 interface, and is connected to the server 30 via a network.

When the computer is started up, a Basic Input Output System (BIOS) chip of the motherboard 10 runs power-on self tests (POST). Then the BIOS chip sends testing codes to the debug card 11 from the 80H address or other addresses. Thus, testers can know which hardware or which connection is wrong if there is a problem. The debug card 11 also receives special testing codes that the programs in the Master Boot Record (MBR) of the hard disk 12 send. These special testing codes indicate a step in the test process. For example, when the MBR sends special testing code A055BB, it indicates that POST is over. The testing codes from the BIOS chip and the current special testing code from the MBR together compose test data. The composed test data are then transmitted to the receiving device 20. The scanner 50 is provided to scan motherboard sequence numbers and operator identifying codes and so on. The receiving device 20 sends the testing codes from the BIOS chip, special current testing code from the MBR, and motherboard sequence numbers and so on from the scanner 50, to the server 30 via the network.

Figure 2:
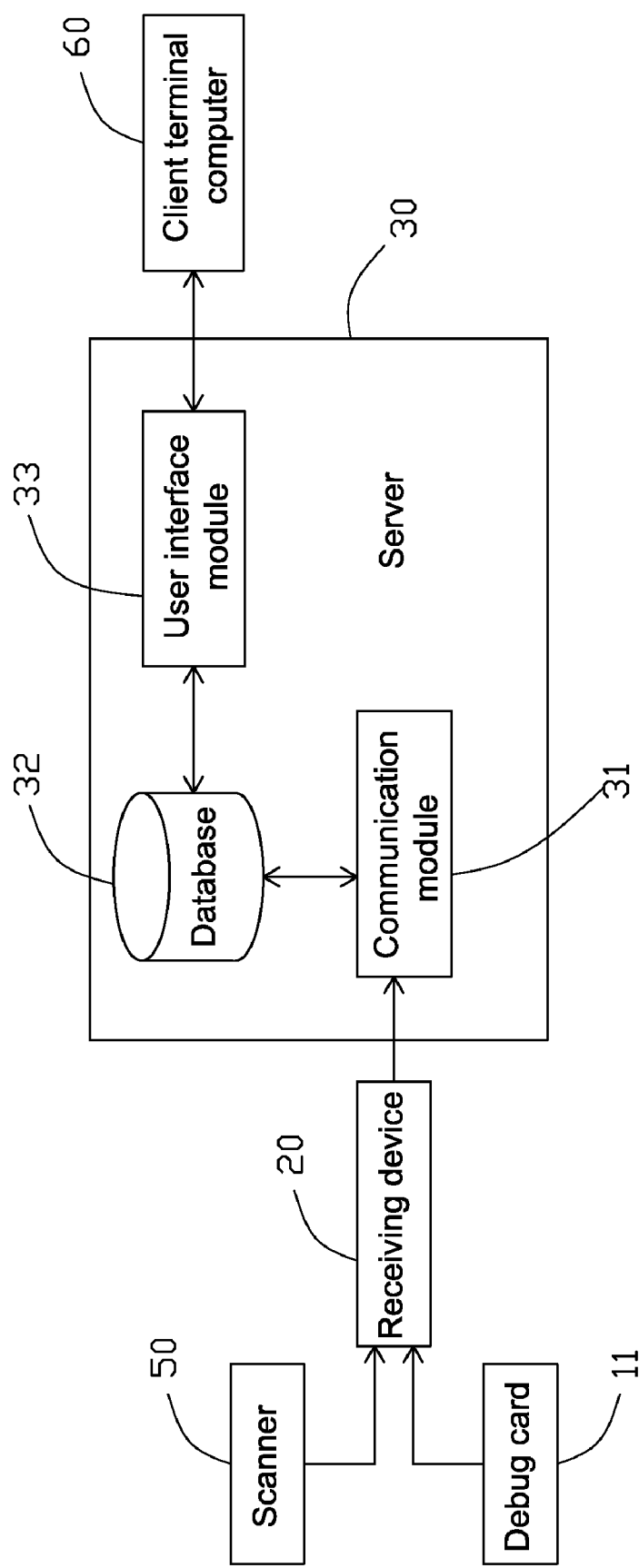
FIG. 2 is another block diagram of the testing device shown in FIG. 1, with more detail regarding a server and the addition of a client terminal computer.

Referring to FIG. 2, the server 30 includes a communication module 31, a database 32, and a user interface module 33. The communication module 31 receives the testing information sent from the receiving device 20 and transmits the testing information to the database 32. The database 32 stores the testing information. The user interface module 33 is an interface for receiving commands from web users and inquiring of the database 32. The user interface module 33 also has other functions, for example, account management, setting administrator and guest accounts, and making statistic report forms and so on. A client terminal computer 60 communicates with the server 30 via the user interface module 33.

Figure 3:
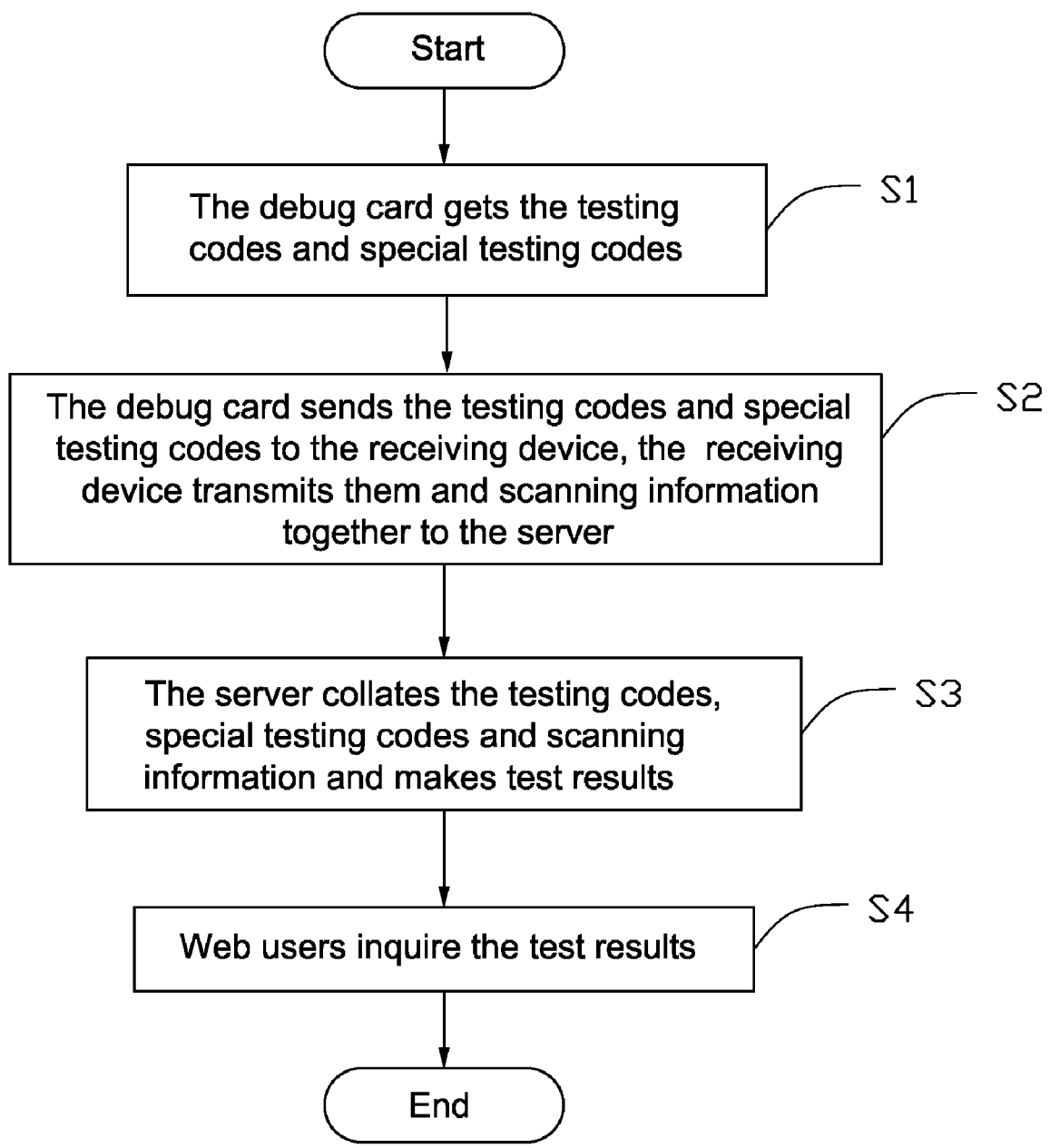
FIG. 3 is a flow chart of a testing method in accordance with an embodiment of the present invention.

Referring also to FIG. 3, the testing method for testing the motherboard 10 includes the following steps:

Step 1: When the computer is switched on, the BIOS chip runs POST, and then the BIOS chip sends testing codes to the debug card 11 from 80H address or other addresses. The debug card 11 also gets special testing codes sent by the MBR of the hard disk 12. These special testing codes indicate a step in the test process.

Step 2: The debug card 11 sends test data for a just completed step in the test process, the test data include the testing codes from the BIOS, and the special testing codes to the receiving device 20 via the serial port. The scanner 50 scans motherboard sequence numbers and so on. Then the receiving device 20 sends the testing codes, the special testing codes, and information from scanner 50 to the server 30 via the network.

Step 3: The receiving device 20 sends the testing codes, special testing codes, and the information from the scanner 50 to the communication module 31. The communication module 31 collates the received data and sends the data to the database 32 of the server 30 for storing.

Step 4: The client terminal computer 60 sends commands to the server 30. The user interface module 33 of the server 30 sends inquiries to the database 32. The database 32 returns answers to the queries to the user interface module 33 and then users can see the answers on a web site accessed by the client terminal computer 60.

Compared with the conventional testing device and testing method, the testing device can automatically collect test information before the operating system is loaded. If the motherboard 10 has some problems after the computer is started up and prior to loading of the operating system, testers can still get the testing information. Thus, testers could know why the motherboard 10 was wrong before the operating system is loaded.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A testing system for testing a motherboard comprising:
    a debug card for attachment to the motherboard and configured for getting test data from the motherboard;
    a receiving device connected to the debug card and configured for receiving the test data from the debug card;
    a server configured for receiving the test data from the receiving device, the server comprising a communication module communicating with the receiving device, a database for storing the test data from the communication module and a user interface module configured for sending inquiring requests to the database, the communication module being configured for collating the test data, the user interface module being configured for analyzing inquiring results from the database, thereby making test results; and
    a scanner for scanning motherboard sequence numbers, wherein the scanner connects to the receiving device, and the receiving device transmits the test data and scanning information to the server.

2. The testing system as described in claim 1, wherein the test data include the testing codes from the BIOS chip before the operating system is loaded.

3. The testing system as described in claim 2, wherein the test data include special testing codes from the MBR programs in a hard disk coupled to the motherboard.

4. The testing system as described in claim 1, further comprising a client terminal computer connecting to the server, wherein the client terminal computer communicates with the user interface module, for inquiring test results.

5. A testing method for testing a motherboard, comprising:
    getting test data from the motherboard using a debug card mounted thereon;
    sending the test data from the debug card to a receiving device;
    transmitting the test data from the receiving device to a server, the server including a communication module, a database and a user interface module;
    receiving and collating the test data using the communication module;
    sending the test data from the communication module to the database;
    storing the test data in the database;
    sending inquiring requests to the database using the user interface module;
    returning inquiring results from the database to the user interface module; and
    analyzing inquiring results, using the user interface module thereby producing testing results.

6. The testing method as described in claim 5, wherein the test data include testing codes from the BIOS chip before the operating system is loaded.

7. The testing method as described in claim 6, wherein the test data include special testing codes from the MBR programs in a hard disk coupled to the motherboard.

8. The testing method as described in claim 5, further comprising steps of scanning motherboard sequence numbers using a scanner, and transmitting the scanning information from the receiving device to the server.

9. The testing method as described in claim 5, further comprising a step of inquiring test results using a client terminal computer connected to the server.

* * * * *